United States Patent
Ganesan et al.

(10) Patent No.: US 10,677,956 B2
(45) Date of Patent: Jun. 9, 2020

(54) ACTIVE DAMPING FOR NMR LOGGING TOOLS

(71) Applicant: Schlumberger Technology Corporation, Sugar Land, TX (US)

(72) Inventors: Krishnamurthy Ganesan, Sugar Land, TX (US); Soumyajit Mandal, Cambridge, MA (US); Van D. M. Koroleva, Newton, MA (US); Gabriela Leu, Richmond, TX (US); Payam Tabrizi, Missouri City, TX (US); Nicholas Heaton, Sugar Land, TX (US); Martin D. Hurlimann, Newton, MA (US); Yi-Qiao Song, Newton Center, MA (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 0 days.

(21) Appl. No.: 15/765,245

(22) PCT Filed: Sep. 8, 2016

(86) PCT No.: PCT/US2016/050606
§ 371 (c)(1),
(2) Date: Mar. 30, 2018

(87) PCT Pub. No.: WO2017/058482
PCT Pub. Date: Apr. 6, 2017

(65) Prior Publication Data
US 2018/0299579 A1    Oct. 18, 2018

Related U.S. Application Data
(60) Provisional application No. 62/236,071, filed on Oct. 1, 2015.

(51) Int. Cl.
*G01V 3/32*    (2006.01)
*G01R 33/44*    (2006.01)
(Continued)

(52) U.S. Cl.
CPC .............. *G01V 3/32* (2013.01); *E21B 47/122* (2013.01); *G01R 33/3671* (2013.01); *G01R 33/448* (2013.01); *G01V 3/38* (2013.01)

(58) Field of Classification Search
CPC .... G01V 3/32; E21B 47/122; G01R 33/3671; G01R 33/448
See application file for complete search history.

(56) References Cited

U.S. PATENT DOCUMENTS
| | | |
|---|---|---|
| 6,018,243 A | 1/2000 | Taicher et al. |
| 2003/0128032 A1 | 7/2003 | Heaton et al. |

(Continued)

FOREIGN PATENT DOCUMENTS
WO    WO2004099817 A2    11/2004

OTHER PUBLICATIONS
International Search Report and Written Opinion issued in International Patent application PCT/US2016/050606, dated Dec. 22, 2016. 17 pages.

(Continued)

*Primary Examiner* — Gregory H Curran

(57) ABSTRACT

A method for measuring one or more properties of a formation includes applying a magnetic field to a subterranean formation using a downhole tool. A radiofrequency signal is transmitted into the subterranean formation that is exposed to the magnetic field. The radiofrequency signal induces a transverse magnetization in the subterranean formation, and the transverse magnetization induces an initial voltage signal in the downhole tool. The initial voltage signal is amplified using a first amplifier in the downhole tool such that the first (Continued)

amplifier outputs a first amplified voltage signal. The first amplified voltage signal is introduced to an input of the first amplifier, such that the first amplifier amplifies the first amplified voltage signal and outputs a second amplified voltage signal.

20 Claims, 10 Drawing Sheets

(51) Int. Cl.
  *G01R 33/36* (2006.01)
  *E21B 47/12* (2012.01)
  *G01V 3/38* (2006.01)

(56) References Cited

U.S. PATENT DOCUMENTS

| | | |
|---|---|---|
| 2004/0140800 A1 | 7/2004 | Madio et al. |
| 2013/0234704 A1 | 9/2013 | Hurlimann et al. |
| 2014/0209308 A1* | 7/2014 | Baldasaro ............... C04B 28/02 166/293 |

OTHER PUBLICATIONS

Hoult, D.I., "Fast recovery, high sensitivity NMR probe and pre-amplifier for low frequencies", Review of Scientific Instruments, 50(2), pp. 193-200 (1979).

Borneman et al., "Bandwidth-limited control and ringdown suppression in high-Q resonators", Journal of Magnetic Resonance, 225, pp. 120-129 (2012).

* cited by examiner

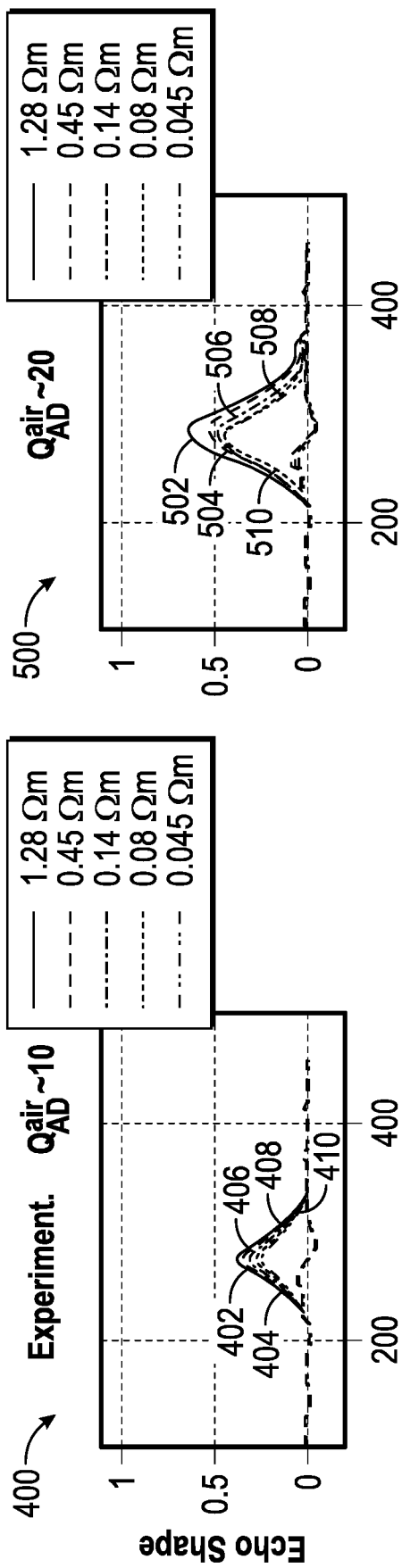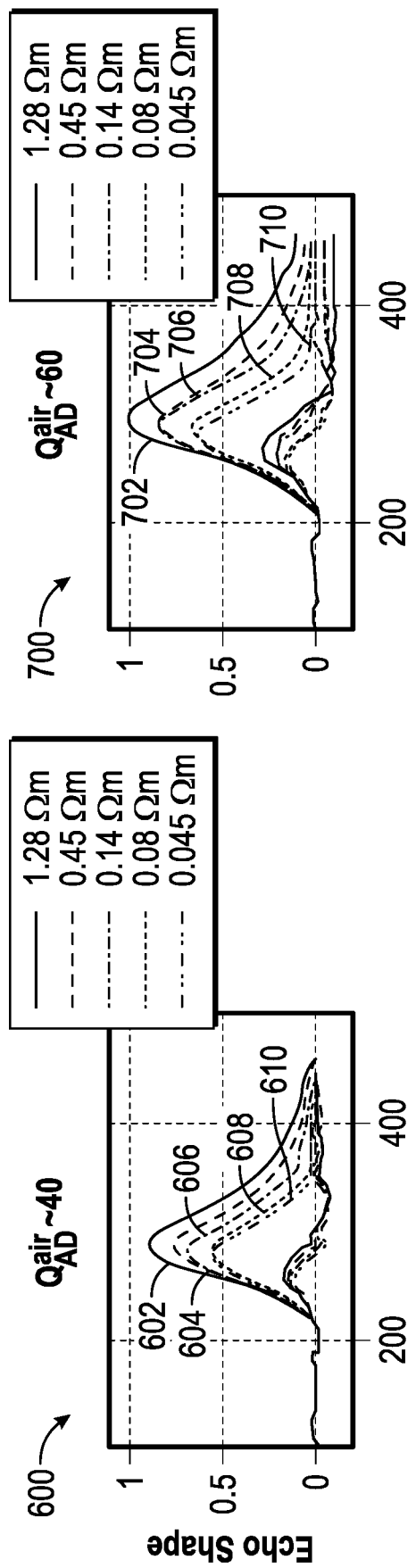

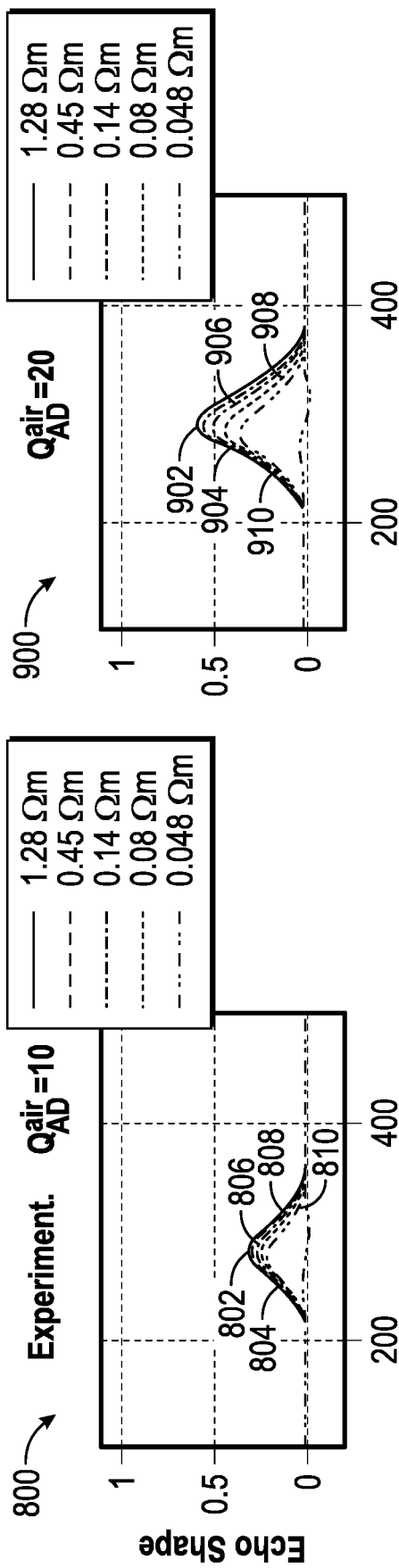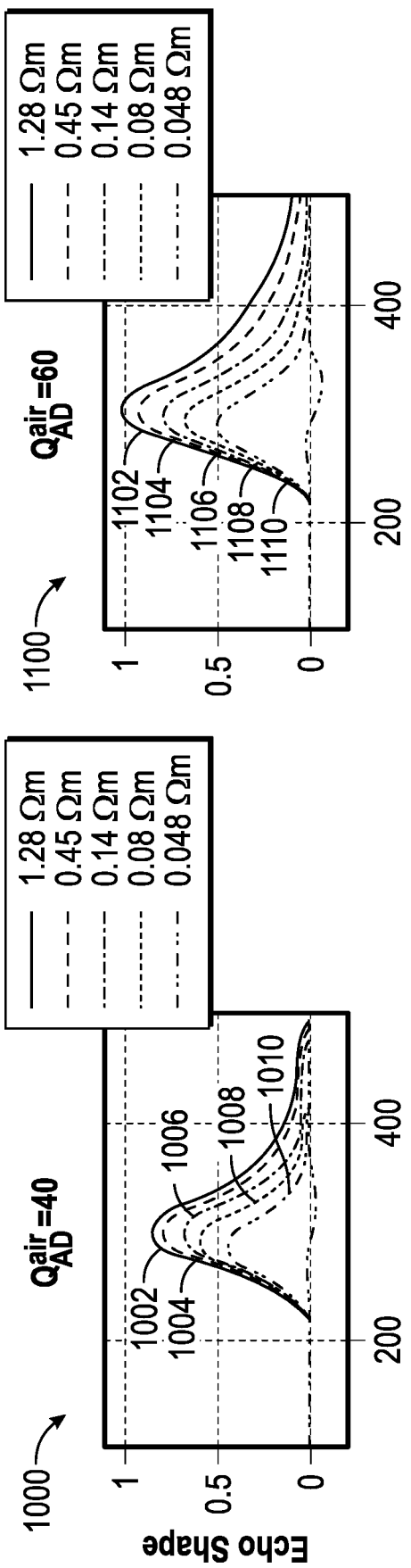

ACTIVE DAMPING FOR NMR LOGGING TOOLS

CROSS-REFERENCE TO RELATED APPLICATIONS

The present application claims priority to U.S. Provisional Application 62/236,071 filed Oct. 1, 2015, the entirety of which is incorporated by reference.

FIELD OF THE INVENTION

Embodiments described herein generally relate to downhole tools. More particularly, such embodiments relate to active damping in a nuclear magnetic resonance ("NMR") logging tool.

BACKGROUND INFORMATION

In wellbores having mud with high salinities, the electromagnetic couplings between the NMR probe (i.e., sensor) and the conductive mud may deteriorate the performance of the NMR logging tool, resulting in inconsistent signal amplitudes. This is known as the "salinity effect." For example, the quality factor ("Q") of the MR Scanner coil decreases by a factor about six as the wellbore conductivity increases from 0 Siemens per meter ("S/m") to 20 S/m. The NMR logging tools are calibrated using a non-conductive sample. However, if the mud in the wellbore has a high salinity, using the calibration performed with the non-conductive sample underestimates the porosity of the formation. Some NMR logging tools are also calibrated using conductive samples. During logging, electrical measurements are performed that are sensitive to the conductivity. These measurements are then used to correct for the salinity effect. However, when the corrections are large, the resulting uncertainties in the porosity become also large.

Smaller echo spacing may help improve the accuracy of total measured NMR porosity, especially in unconventional reservoirs where transverse relaxation times are short. One factor limiting the echo time reduction is the recovery period following each radio frequency ("RF") pulse during which the NMR signal cannot be detected. The receiver recovers from the high power RF pulse exponentially, and the time constant t of the recovery is proportional to Q. As such $t=2Q/w_0$, where $w_0$ is the angular operating frequency. At low operating frequencies, like in NMR logging tools, the recovery time may be even longer, making it difficult to reduce the echo spacing and accurately measure the total formation porosity. The recovery time, or ring-down time, is known as the "ringing." Furthermore, at low operating frequencies and high receiver Q, the NMR signal may be delayed in time and distorted in shape, which complicates the quantitative signal analysis. To decrease the receiver Q, the user may add a damping resistor in parallel with the probe capacitor; however, this also reduces the signal-to-noise ratio ("SNR").

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

A method for measuring one or more properties of a formation is disclosed. The method includes applying a magnetic field to a subterranean formation using a downhole tool. A radiofrequency signal is transmitted into the subterranean formation that is exposed to the magnetic field. The radiofrequency signal induces a transverse magnetization in the subterranean formation, and the transverse magnetization induces an initial voltage signal in the downhole tool. The initial voltage signal is amplified using a first amplifier in the downhole tool such that the first amplifier outputs a first amplified voltage signal. The first amplified voltage signal is introduced to an input of the first amplifier, such that the first amplifier amplifies the first amplified voltage signal and outputs a second amplified voltage signal.

In another embodiment, the method includes running a downhole tool into a wellbore in a subterranean formation. A magnetic field is applied to the subterranean formation using the downhole tool. A radiofrequency signal is transmitted into the subterranean formation that is exposed to the magnetic field. The radiofrequency signal induces a transverse magnetization in the subterranean formation, and the transverse magnetization induces an initial voltage signal in the downhole tool. The initial voltage signal is amplified using a first amplifier in the downhole tool such that the first amplifier outputs a first amplified voltage signal. The first amplified voltage signal is introduced into an integrator and a capacitor. The first amplified voltage signal is introduced to an input of the first amplifier after the first amplified voltage signal is introduced to the integrator and the capacitor, such that the first amplifier amplifies the first amplified voltage signal and outputs a second amplified voltage signal. The second amplified voltage signal is amplified using a second amplifier in the downhole tool such that the second amplifier outputs an output voltage. One or more properties of the subterranean formation is determined using the output voltage.

An apparatus for measuring one or more properties of a formation is also disclosed. The apparatus includes an antenna that receives an initial voltage signal. A first amplifier is electrically-connected to the antenna and receives the initial voltage signal from the antenna and produces a first amplified voltage signal. An integrator is electrically-coupled to an output of the first amplifier and receives the first amplified voltage signal from the first amplifier. A first capacitor is electrically-coupled to the integrator and receives the first amplified voltage signal from the integrator. An output of the capacitor is electrically-connected to an input of the first amplifier. The first amplified voltage signal is introduced to the input of the first amplifier after the first amplified voltage signal is introduced to the integrator and the capacitor, such that the first amplifier amplifies the first amplified voltage signal and outputs a second amplified voltage signal.

BRIEF DESCRIPTION OF THE DRAWINGS

So that the recited features may be understood in detail, a more particular description, briefly summarized above, may be had by reference to one or more embodiments, some of which are illustrated in the appended drawings. It is to be noted, however, that the appended drawings are illustrative embodiments, and are, therefore, not to be considered limiting of its scope.

FIGS. 4-7 depict graphs showing measured echo shapes for different salinities and quality factors (e.g., $Q_{AD}^{air}$), according to an embodiment.

FIGS. 8-11 depict graphs showing simulated echo shapes for different salinities and quality factors (e.g., $Q_{AD}^{air}$), according to an embodiment.

DETAILED DESCRIPTION

The active damping technique disclosed herein may reduce the variation of the Q of the receiver with the salinity of the mud in the wellbore, while introducing minimal noise into the measurement. This may retain the high SNR of the un-dampened receiver. The active damping technique disclosed herein may also be used to reduce the sensitivity to wellbore and formation conductivity, enabling improved porosity accuracy and precision in saline environments. It may also be used to reduce the echo spacing through improved damping of antenna ringing. Furthermore, with active damping, the Q of the receiver (e.g., NMR antenna+ preamplifier) may be varied independently of the Q of the NMR antenna, without affecting the noise level. As the Q of the antenna changes due to salinity effects, the Q of the receiver may not change as much. Therefore, the salinity effect on the measured downhole NMR porosity may be reduced.

Figure 1:
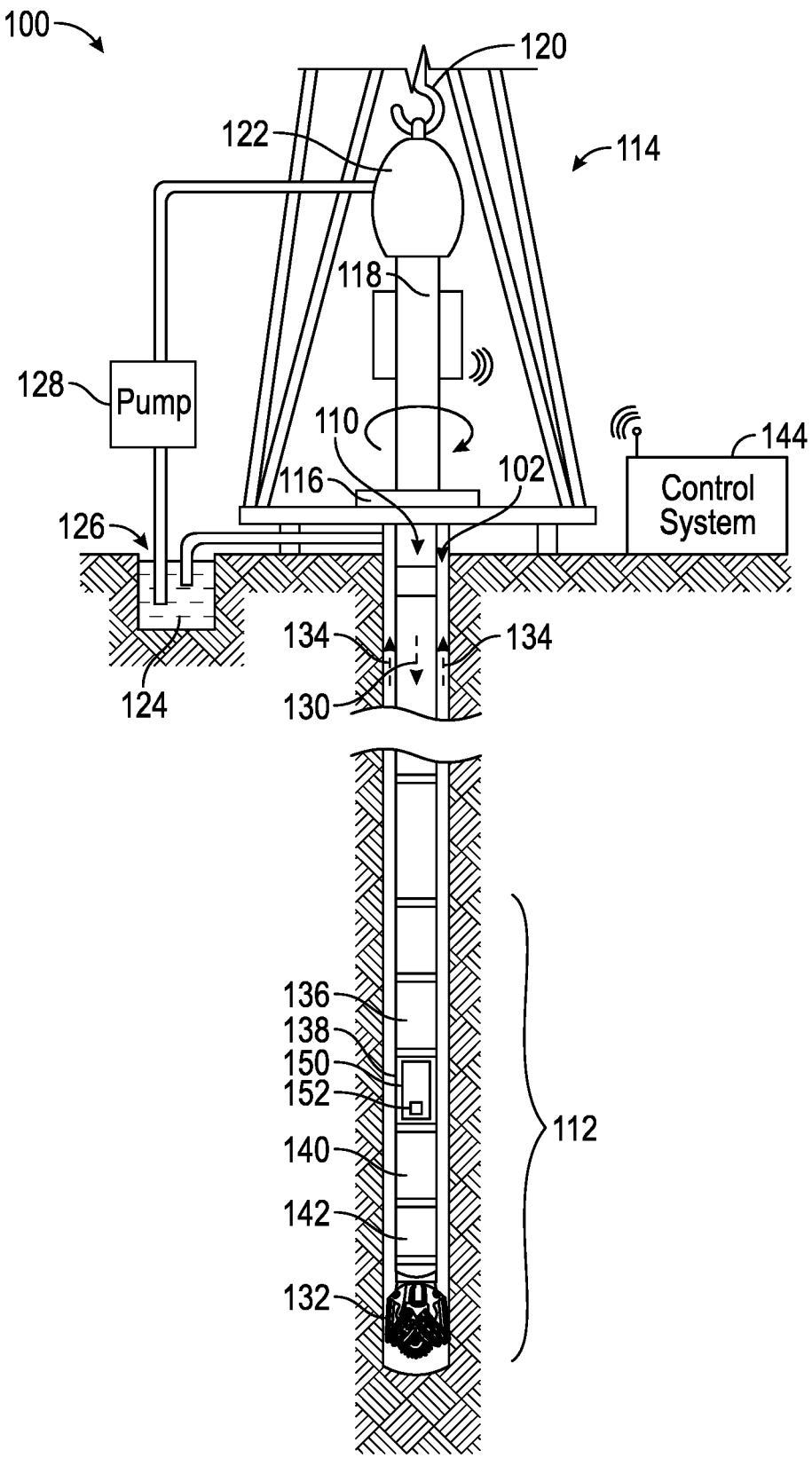
FIG. 1 depicts a schematic side view of an illustrative well site system including a drill string and a downhole tool disposed within a wellbore, according to an embodiment.

FIG. 1 depicts a schematic side view of an illustrative well site system 100 including a drill string 110 and a downhole tool 112 disposed within a wellbore 102, according to an embodiment. The well site system 100 may be deployed in either onshore or offshore applications. In this type of system, the wellbore 102 may be formed in subsurface formations by rotary drilling in a manner that is well-known to those skilled in the art. Some embodiments may also use directional drilling.

The drill string 110 may be suspended within the wellbore 102. The well site system 100 may include a platform and derrick assembly 114 positioned over the wellbore 102, with the derrick assembly 114 including a rotary table 116, a kelly 118, a hook 120, and a rotary swivel 122. In a drilling operation, the drill string 110 may be rotated by the rotary table 116, which engages the kelly 118 at the upper end of the drill string 110. The drill string 110 may be suspended from the hook 120, attached to a traveling block (not shown), through the kelly 118 and the rotary swivel 122, which permits rotation of the drill string 110 relative to the hook 120. As is well-known, a top drive system may be used in other embodiments.

Drilling fluid or mud 124 may be stored in a pit 126 formed at the well site. A pump 128 may deliver the drilling fluid 124 to the interior of the drill string 110 via a port in the swivel 122, which causes the drilling fluid 124 to flow downwardly through the drill string 110, as indicated by the directional arrow 130. The drilling fluid exits the drill string 110 via ports in a drill bit 132, and then circulates upwardly through the annulus region between the outside of the drill string 110 and the wall of the wellbore 102, as indicated by the directional arrows 134. In this known manner, the drilling fluid lubricates the drill bit 132 and carries formation cuttings up to the surface as it is returned to the pit 126 for recirculation.

In the illustrated embodiment, the downhole tool 112 may be or include a bottom hole assembly ("BHA"). The downhole tool 112 is shown as having a rotary steerable system (RSS), a motor 142, and the drill bit 132. The downhole tool 112 may also include a measurement-while-drilling ("MWD") tool 136 and one or more logging-while-drilling ("LWD") tools (two are shown: 138, 140). The MWD tool 136 may be configured to measure one or more physical properties as the wellbore 102 is being drilled or at any time thereafter. The LWD tools 138, 140 may be configured to measure one or more formation properties and/or wellbore physical properties as the wellbore 102 is being drilled or at any time thereafter. The formation properties may include resistivity, density, porosity, sonic velocity, gamma rays, and the like. The physical properties may include pressure, temperature, wellbore caliper, wellbore trajectory, a weight-on-bit, torque-on-bit, vibration, shock, stick slip, and the like. For example, the LWD tools 138, 140 may be or include one or more NMR logging tools (one is shown: 150). In other embodiments, the NMR logging tool 150 may be a wireline tool rather than part of the LWD tools 138, 140. The NMR logging tool 150 may include a detection coil (referred to herein as an antenna) 152 that may measure the properties of nuclear spins in the formation, such as the longitudinal (or spin-lattice) relaxation time (referred to as $T_1$), transverse (or spin-spin) relaxation time (referred to as $T_2$), and a diffusion coefficient (D). Knowledge of these NMR properties may help aid in the determination of basic formation properties such as permeability and porosity, as well as the fluid properties such as fluid type and viscosity. Multi-dimensional NMR techniques may provide quantitative fractions of different fluids (e.g., oil, water, gas) and a better understanding of the diffusion properties of these fluids in the surrounding formation, including the effects of geometry and restricted diffusion.

Figure 2:
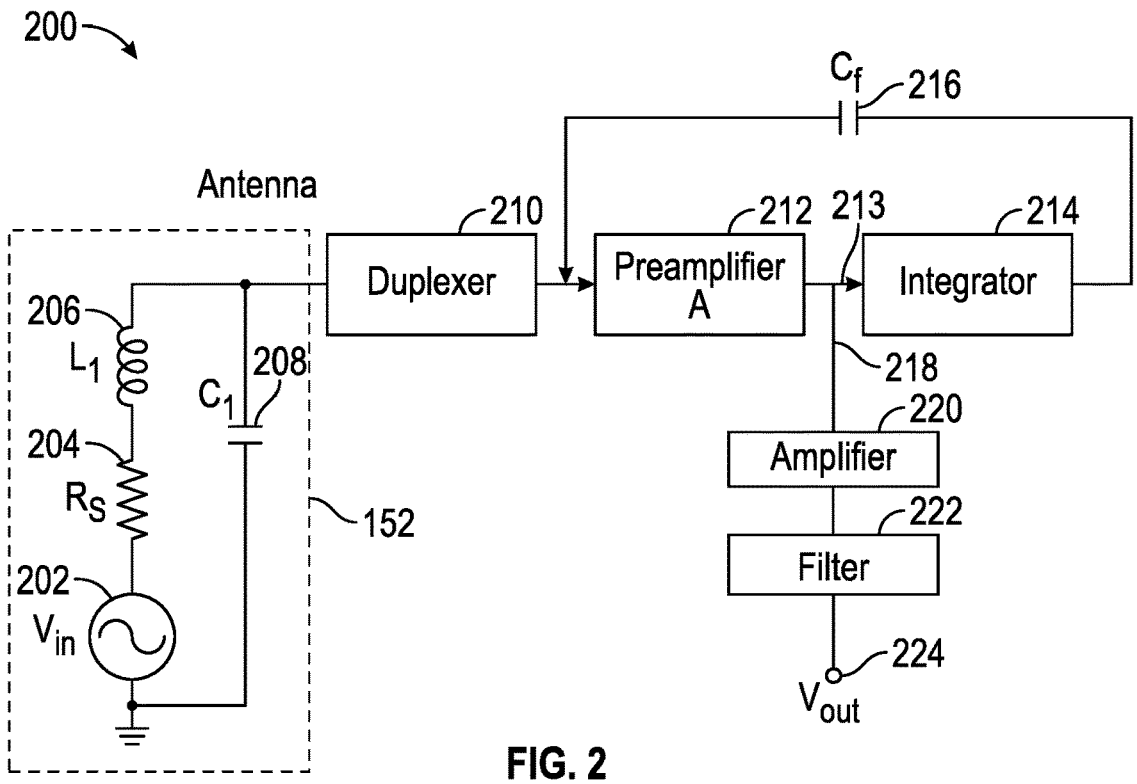
FIG. 2 depicts a schematic view of an active damping receiver circuit that may be disposed within a logging-while-drilling ("LWD") tool in the downhole tool, according to an embodiment.

FIG. 2 depicts a schematic view of an active damping receiver circuit 200 that may be disposed within the LWD or wireline NMR tool 138, 140 (e.g., in the NMR logging tool 150) in the downhole tool 112, according to an embodiment. The circuit 200 may include a voltage signal generator 202, a resistor, 204, and an inductor 206 that are electrically-connected in series with one another. The voltage signal generator 202 may generate an initial voltage signal that is induced by the transverse magnetization in the subterranean formation, as discussed below. A first capacitor 208 may be in parallel with the initial voltage signal 202, the resistor, 204, and the inductor 206. The resistor 204 represents the losses in the antenna circuit 152, including the losses caused by the conductive formation. The inductor 206 and the first capacitor 208 may be electrically-connected to an input of a duplexer 210. The duplexer 210 may be configured to allow bi-directional communication over a single path. For example, the duplexer 210 may isolate a receiver from a transmitter while permitting these components to share a common antenna 152.

The output of the duplexer 210 may be electrically-connected to a preamplifier 212. The preamplifier 212 may prepare the initial voltage signal 202 for further amplification and/or processing. The output of the preamplifier 212 may be electrically-connected to an integrator 214. The preamplifier 212 may output an initial voltage 213, which may be received by the integrator 214. The output of the integrator 214 may be the time integral of the input into the integrator 214. The output of the integrator 214 may be electrically-connected to a second capacitor 216. The output of the second capacitor 216 may be electrically-connected to the input of the preamplifier 212.

The integrator 214 and the second capacitor 216 may provide active damping to the circuit 200. Active damping may employ negative feedback to reduce the input impedance of the preamplifier 212, thereby reducing the Q of the circuit 200 without introducing extra noise at the input of the preamplifier 212.

The expressions relating the Q of the circuit 200 to the properties of the circuit 200 are summarized in Equation 1 below. $Q_0$ represents the Q of the antenna 152, which includes the inductance L of inductor 206 and the series resistance $R_s$ of the resistor 204. $C_f$ represents the feedback capacitor value of the second capacitor 216, $\tau$ represents the time constant of the integrator 214, and A represents the gain of the preamplifier 212. For a given antenna, the $C_f$ value may be selected for a desired system Q, referred to herein as $Q_{AD}^{air}$.

$$Q_0 = (\omega_0 * L_1)/R_s \quad (1)$$

$$Q_{AD}^{air} = \frac{Q_0}{1 + Q_0(\omega_0 L_1)\left(\frac{AC_f}{\tau}\right)} \quad (2)$$

The $C_f$ of the second capacitor 216 may be varied for a given set of antenna parameters to obtain different active damping $Q_{AD}^{air}$. $Q_{AD}^{air}$~60 corresponds to a case without the feedback capacitor 216 (i.e. without active damping), which is similar to a conventional receiver. The $C_f$ values and the corresponding dampened system $Q_{AD}^{air}$ are listed in Table 1.

TABLE 1

| Capacitor $C_f$ [pF] | $Q_{AD}^{air}$ |
|---|---|
| 150 pF | ~10 |
| 56 pF | ~20 |
| 15 pF | ~40 |

TABLE 1-continued

| Capacitor $C_f$ [pF] | $Q_{AD}^{air}$ |
|---|---|
| No feedback Capacitor (without AD) | ~60 |

$Q_{AD}^{air}$ refers to the Q of the system of the unloaded antenna (e.g., in air), and $Q_{AD}$ refers to the measured Q of the system at various salinities.

Experimental Parameters and Modeling Setup

The water salinity was varied from 0.78 S/m to 20 S/m, which corresponds to water resistivities of 1.28 Ωm to 0.05 Ωm. The data was plotted as a function of the water resistivity. The range of investigation for $Q_{AD}^{air}$ ranged from highly dampened (~10) to no damping (~60).

The active damping was modeled using a noiseless damping resistor connected in parallel with the receiver circuit 200. This model captures the basic concept of active damping (i.e., damping the Q of the receiver circuit 200 without increasing the noise figure of the receiver circuit 200). The value of the damping resistor was selected to create the desired Q without active damping ($Q_{AD}^{air}$), approximately equal to 10, 20, 40 and 60. Different salinities were obtained by using different measured values of the antenna components.

System Q Variation (OAD) with Salinity

Figure 3:
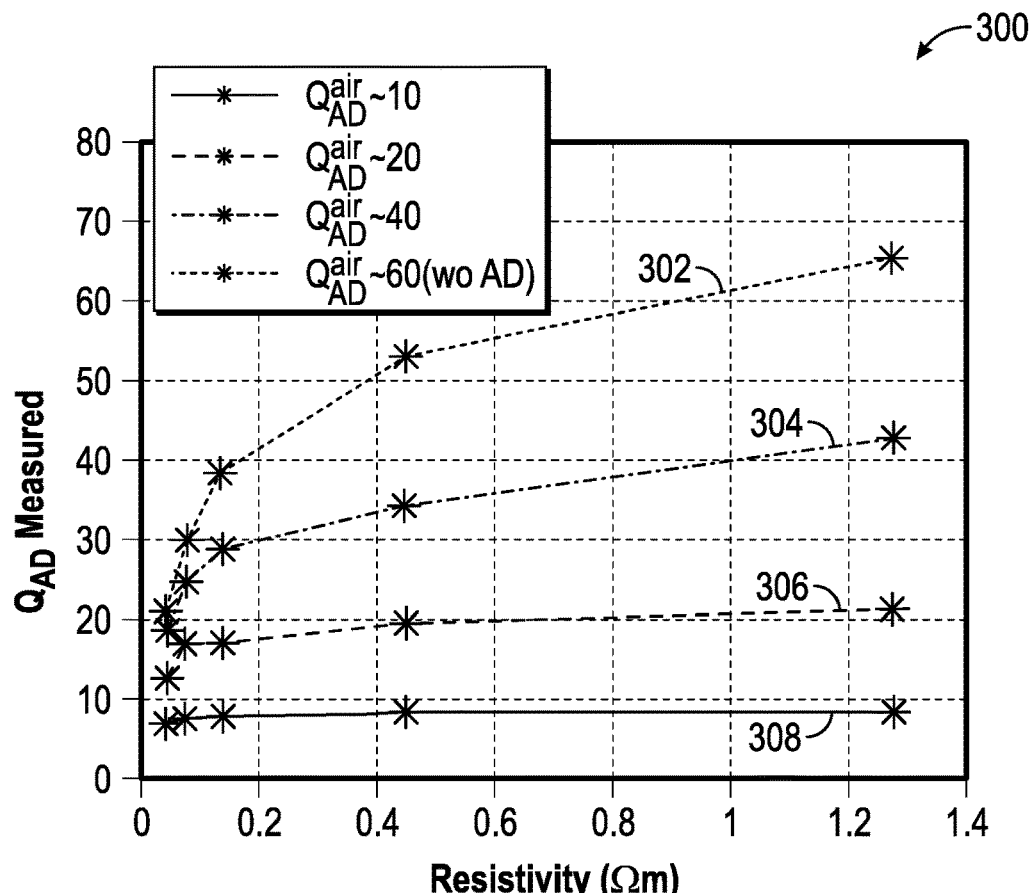
FIG. 3 depicts a graph showing the measured system quality factor ("$Q_{AD}$") as a function of salinity, according to an embodiment.

FIG. 3 depicts a graph 300 showing the measured system quality factor ("$Q_{AD}$") as a function of salinity, according to an embodiment. The losses in the antenna 152 increase when the antenna 152 is surrounded by saline water, which results in a lower Q of the antenna 152 and therefore a lower system $Q_{AD}$, as shown in FIG. 3. The data shows that the system $Q_{AD}$ reduction with salinity (e.g., over the entire salinity range investigated) is less with greater damping (i.e., lower system $Q_{AD}^{air}$). More specifically, there is about a 70% reduction without active damping ($Q_{AD}^{air}$~60) versus a 40% reduction with active damping ($Q_{AD}^{air}$~20).

Echo Shape Variation with Salinity

FIGS. 4-7 depict graphs 400-700 showing measured echo shapes for $Q_{AD}^{air}$~10, 20, 40 and 60 (60=without active damping) for different salinities and quality factors (e.g., $Q_{AD}^{air}$), and FIGS. 8-11 depict graphs 800-1100 showing simulated echo shapes for different salinities and quality factors (e.g., $Q_{AD}^{air}$), according to an embodiment. Reference number 402 refers to the curve representing 1.28 Ωm, reference number 404 refers to the curve representing 0.45 Ωm, reference number 406 refers to the curve representing 0.14 Ωm, reference number 408 refers to the curve representing 0.08 Ωm, and reference number 410 refers to the curve representing 0.045 Ωm.

The graphs 400-1100 are normalized to the echo shape for fresh water without active damping ($Q_{AD}^{air}$~60). The data shows that the variability of echo amplitude and shape with salinity may be reduced with active damping. The modeling reproduces the measurements in the following aspects: (1) higher echo amplitude at higher $Q_{AD}^{air}$ and higher water resistivity, and (2) more echo delay and more echo distortion at higher receiver $Q_{AD}^{air}$. With active damping, the echo amplitude, shape, and position may not change when the salinity changes.

Signal Amplitude Variation with Salinity

Figure 12:
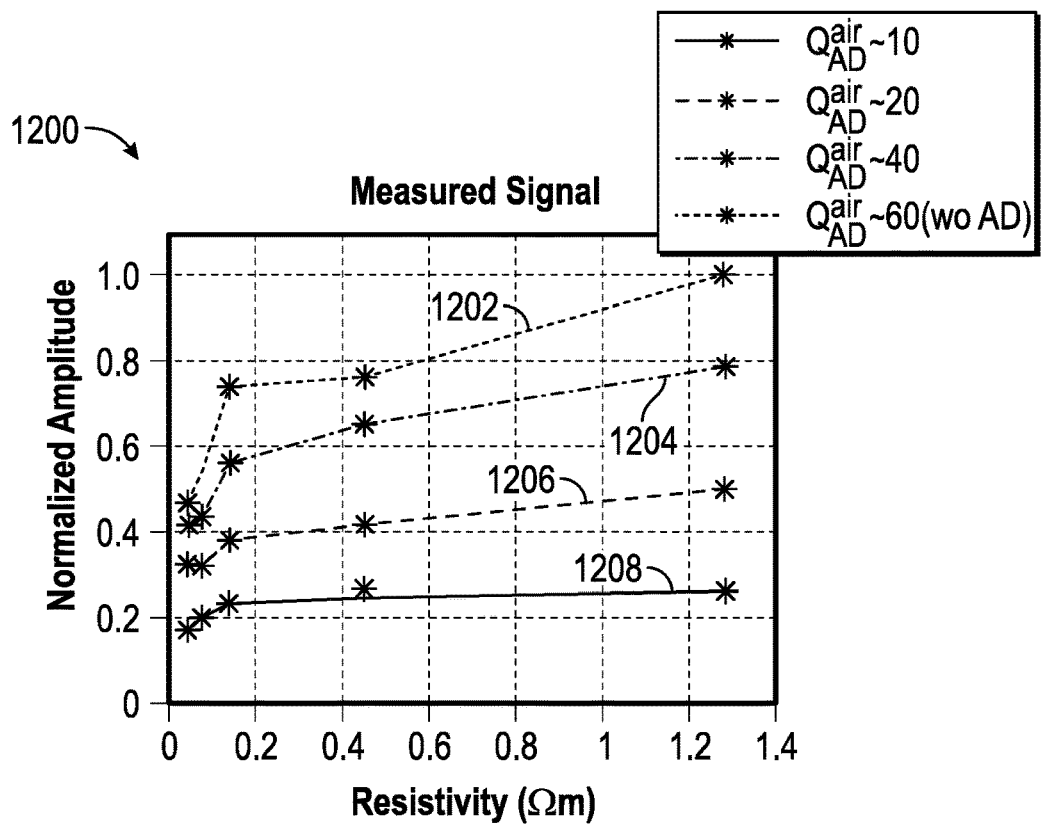
FIG. 12 depicts a graph showing measured signal amplitudes for different quality factors (e.g., $Q_{AD}^{air}$) as a function of salinity, according to an embodiment.
Figure 13:
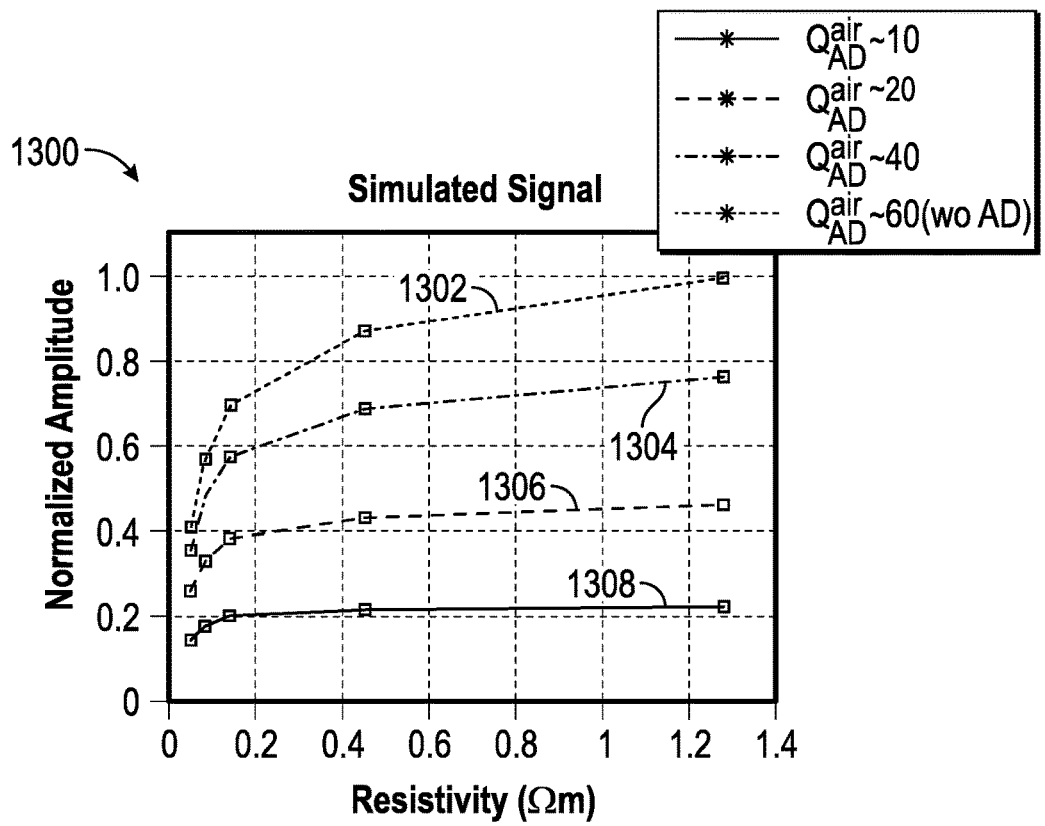
FIG. 13 depicts a graph showing simulated signal amplitudes for different quality factors (e.g., $Q_{AD}^{air}$) as a function of salinity, according to an embodiment.

FIG. 12 depicts a graph 1200 showing measured signal amplitudes for different quality factors (e.g., $Q_{AD}^{air}$) as a function of salinity, and FIG. 13 depicts a graph 1300 showing simulated signal amplitudes for different quality factors (e.g., $Q_{AD}{}^{air}$) as a function of salinity, according to an embodiment. More particularly, FIGS. 12 and 13 show the signal amplitudes (corrected for Hydrogen Index) as a function of salinity for $Q_{AD}{}^{air}$~10, 20, 40 and 60 (60=without active damping). Reference number 1202 refers to the curve representing $Q_{AD}{}^{air}$~60, reference number 1204 refers to the curve representing $Q_{AD}{}^{air}$~40, reference number 1206 refers to the curve representing $Q_{AD}{}^{air}$~20, and reference number 1208 refers to the curve representing $Q_{AD}{}^{air}$~10.

The data shows that the signal amplitude is higher for higher $Q_{AD}{}^{air}$, and it decreases with increasing salinity. The signal amplitude reduction (over the entire salinity range investigated) is less for low active damping $Q_{AD}{}^{air}$, about 35% reduction for $Q_{AD}{}^{air}$~20 versus ~50% reduction without active damping ($Q_{AD}{}^{air}$~60). The variation of the signal amplitude with the salinity may be reduced with active signal damping.

NSR Variation with Salinity

Figure 14:
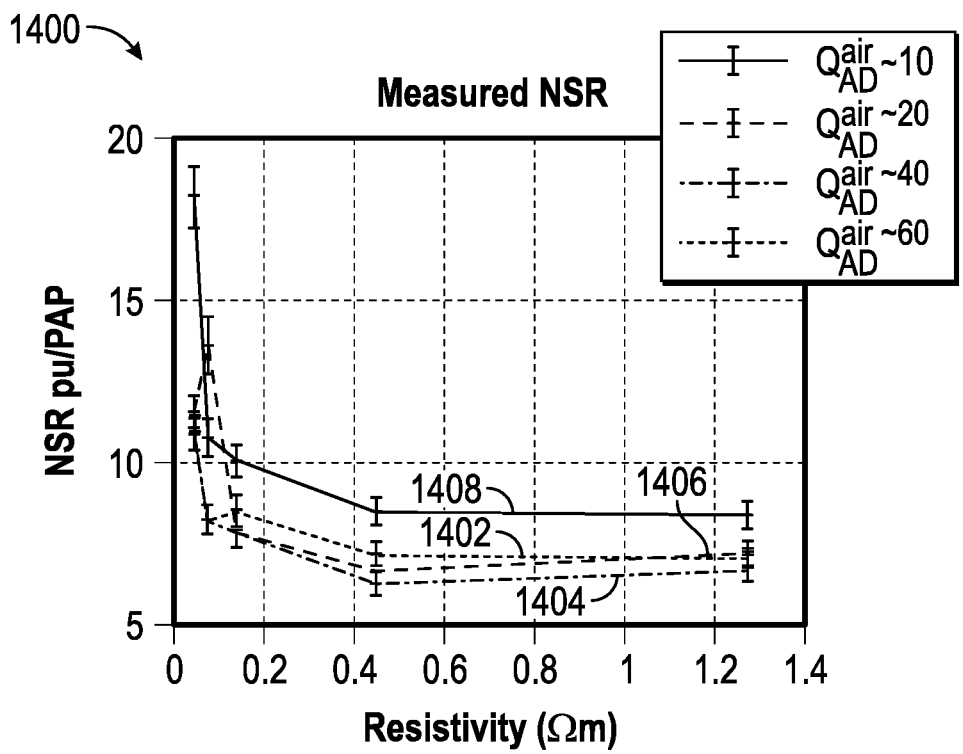
FIG. 14 depicts a graph showing measured noise-to-signal ratios ("NSR") as a function of salinity and quality factor (e.g., $Q_{AD}^{air}$), according to an embodiment.

FIG. 14 depicts a graph 1400 showing measured NSR as a function of salinity and quality factor (e.g., $Q_{AD}{}^{air}$), according to an embodiment. More particularly, FIG. 14 shows, the NSR as a function of salinity for $Q_{AD}{}^{air}$~10, 20, 40 and 60 (without active damping). The data shows that the NSR for $Q_{AD}{}^{air}$~20 and $Q_{AD}{}^{air}$~60 are about the same at a given salinity. Also, the NSR increases with increasing salinity, and is highest at $Q_{AD}{}^{air}$~10 for each of the salinities. With active damping of ~20, the NSR is not increased compared to a standard receiver (i.e., without active damping).

Ringing Variation with Salinity

Figure 15:
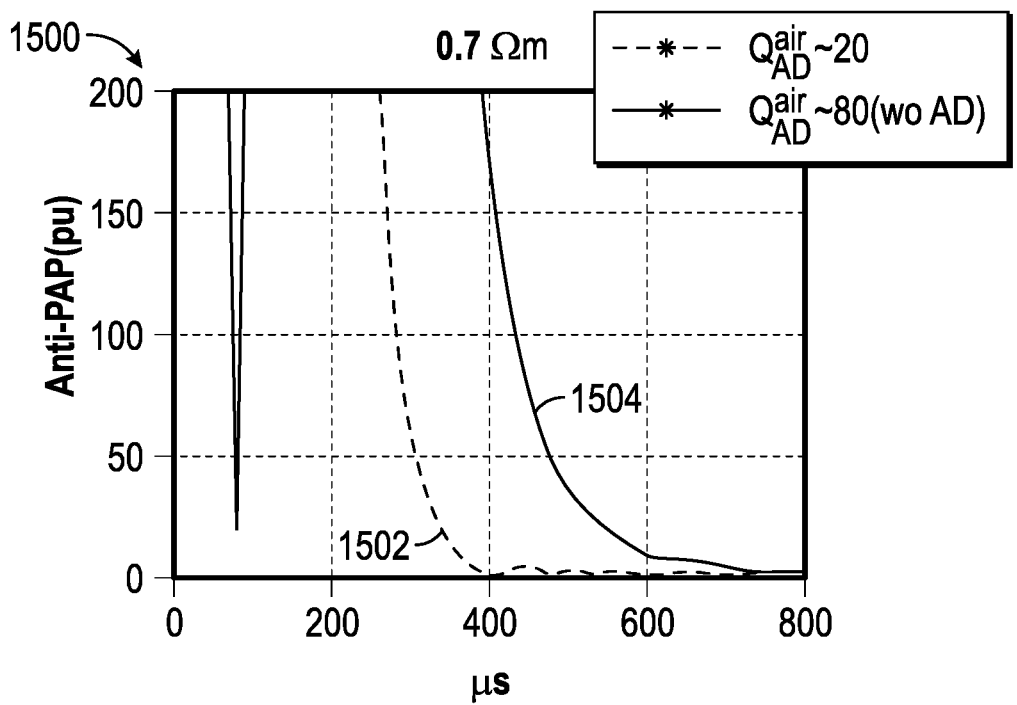
FIGS. 15-17 depict graphs showing ringing as a function of salinity with active damping and without active damping, according to an embodiment.
Figure 16:
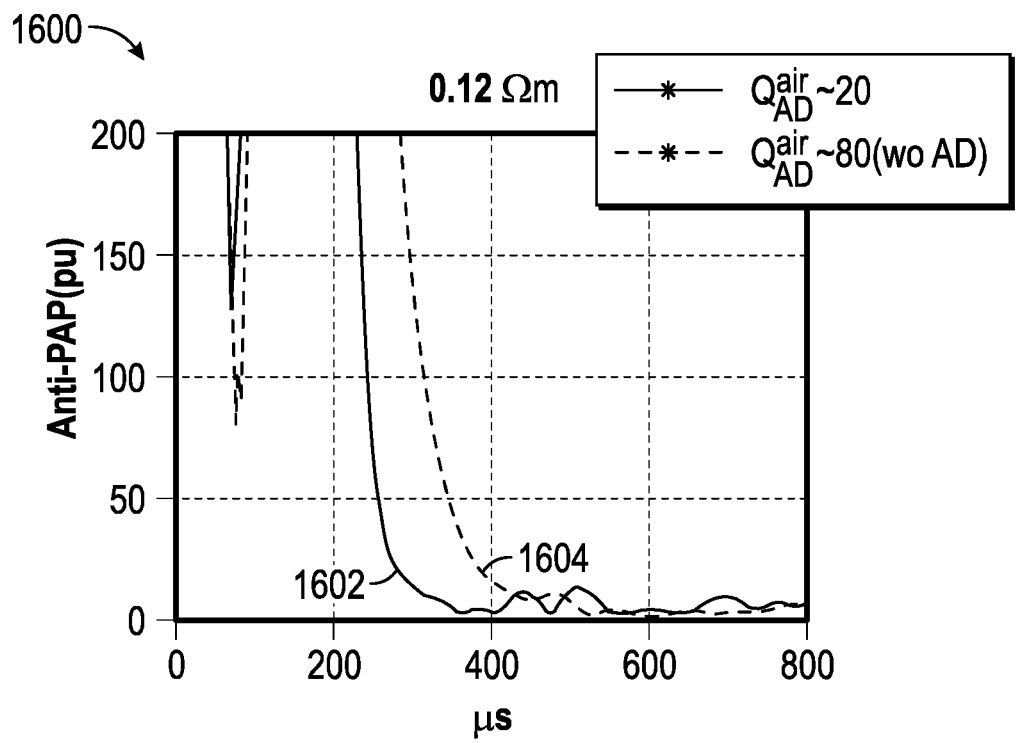
Figure 17:
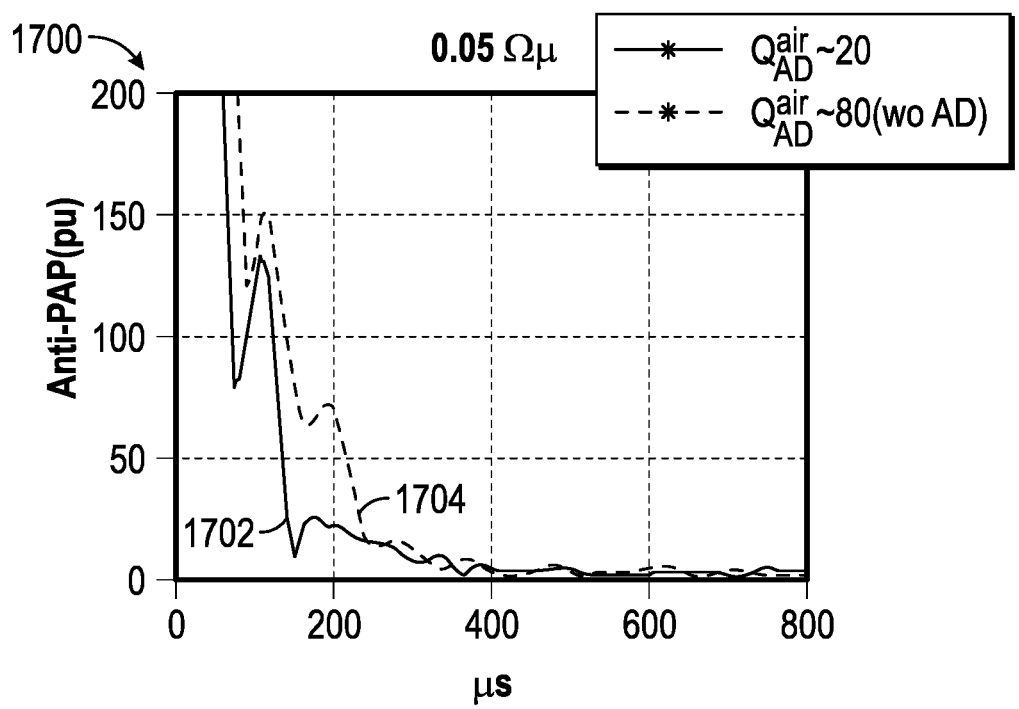

FIGS. 15-17 depict graphs 1500-1700 showing ringing as a function of salinity with active damping and without active damping, according to an embodiment. More particularly, FIGS. 15-17 show the ringing after the 180 RF pulse as a function of salinity with active damping ($Q_{AD}{}^{air}$~20) and without active damping ($Q_{AD}{}^{air}$~80). Reference number 1502 refers to the curve representing $Q_{AD}{}^{air}$~20 (e.g., with active damping), and reference number 1504 refers to the curve representing $Q_{AD}{}^{air}$~80 (e.g., without active damping).

Time zero is at the end of the RF pulse. The data shows that there is less ringing with active damping 1502 compared to without active damping 1504 at low salinity, and the ringing decreases as the salinity increases for both with and without active damping. Also, the variation in the ringing amplitude (over the salinity range investigated) is smaller with active damping. At the highest water salinity (e.g., 0.05 Ωm), the ringing has a component with long time constant for both with and without active damping, and the ringing amplitudes become comparable.

Implications for Q Measurements

NMR porosity precision may be a function of the NSR of the NMR measurement, while NMR porosity accuracy may be affected by environmental corrections. However, environmental corrections themselves may depend on auxiliary measurements made during logging, which include some statistical uncertainty. For NMR logging tools 150, the auxiliary measurements may include temperature, operating frequency, system Q or gain, and in some cases, RF pulse amplitude, $B_1$. The NMR porosity, φ, measured downhole may be computed using Equation (3):

$$\phi = \frac{AMP_{DH}}{AMP_{MC}} \times F_{AUX}(X_{DH}, X_{MC}) \times F_Q(Q_{DH}, Q_{MC}) \quad (3)$$

$AMP_{DH}$ and $AMP_{MC}$ refer to the signal amplitudes measured during downhole logging (DH) and during master calibration (MC) at the surface. The calibration function has been separated into two parts: (1) $F_{AUX}(X_{DH}, X_{MC})$, which is governed by a set of (unspecified) auxiliary measurements X, and, (2) a Q-dependent term, $F_Q(Q_{DH}, Q_{MC})$, which is described in more detail below. For present purposes, $F_{AUX}(X_{DH}, X_{MC})=1$, which may effectively remove it from the porosity expression. In practice, the calibration function $F_Q(Q_{DH}, Q_{MC})$ may be determined by measuring the signal amplitude from water of known porosity (e.g., 100 porosity units, or p.u.) as a function of the Q of the system, which may be varied by changing the salinity of the water. The signal amplitude data (corrected for Hydrogen Index) is plotted in FIGS. 12 and 13. The characterization amplitude data may be normalized to some reference value, which may be the highest $Q_{AD}$ point of the fresh water sample. After normalization is performed for each $Q_{AD}$ dataset, the data is presented in FIG. 18.

Figure 18:
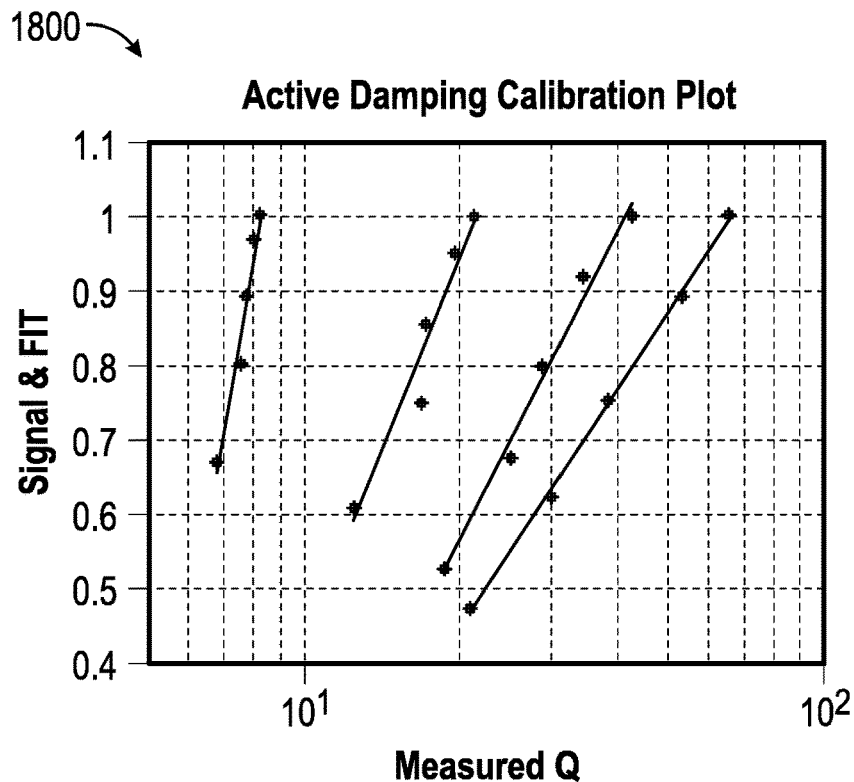
FIG. 18 depicts a graph showing normalized signal amplitude for active damping datasets with $Q_{AD}^{air}$~10, $Q_{AD}^{air}$~20, $Q_{AD}^{air}$~40 and $Q_{AD}^{air}$~60 (i.e., 60=without active damping), ordered from left to right, respectively, according to an embodiment.

FIG. 18 depicts a graph 1800 showing normalized signal amplitude for active damping datasets with $Q_{AD}{}^{air}$~10, $Q_{AD}{}^{air}$~20, $Q_{AD}{}^{air}$~40 and $Q_{AD}{}^{air}$~60 (60=without active damping), ordered from left to right, respectively, according to an embodiment. The lines represent the least squares fits to a log-linear relation for each separate dataset. The data suggests that a semi-logarithmic relationship may adequately represent the observed $Q_{AD}$ variation of the signal amplitude. Thus:

$$\frac{AMP(Q_{AD})}{AMP(Q_{MAX})} = A + B \log(Q_{AD}) \quad (4)$$

The fitting parameters for the different datasets are summarized in Table 2.

TABLE 2

|   | $Q_{AD}{}^{air}$ ~10 | $Q_{AD}{}^{air}$ ~20 | $Q_{AD}{}^{air}$ ~40 | $Q_{AD}{}^{air}$ ~60 |
|---|---|---|---|---|
| A | −2.74 | −1.34 | −1.21 | −0.93 |
| B | 1.77 | 0.77 | 0.59 | 0.46 |

Table 2 represents the coefficients for semi-logarithmic fit of Q-dependence of signal amplitude for each active damping receiver series (defined by $Q_{AD}{}^{air}$). Equation (4) effectively defines the calibration functions for each $Q_{AD}{}^{air}$. Thus:

$$F_{Q_{AD}}^{(Q_{AD}^{air})}(Q_{AD}) = \frac{1}{A^{(Q_{AD}^{air})} + B^{(Q_{AD}^{air})}\log(Q_{AD})} = \left[f_{Q_{AD}}^{(Q_{AD}^{air})}(Q_{AD})\right]^{-1} \quad (5)$$

Now supplied with a functional form for the $Q_{AD}$ dependence of signal amplitude, the porosity sensitivity to the $Q_{AD}$ measurement may be evaluated using Equations (6)-(8):

$$\phi = \frac{AMP(Q_{AD})}{AMP(Q_{MAX})} \times \frac{\partial F_{Q_{AD}}^{(Q_{AD}^{air})}(Q_{AD})}{\partial Q_{AD}} \times Q_{AD} \quad (6)$$

$$\phi = \phi f_{Q_{AD}}^{(Q_{AD}^{air})}(Q_{AD}) \frac{\partial F_{Q_{AD}}^{(Q_{AD}^{air})}(Q_{AD})}{\partial Q_{AD}} \times Q_{AD} \quad (7)$$

-continued $$\frac{\Delta \Phi}{\Phi} = \frac{-B}{Q_{AD} \times f_{Q_{AD}}^{(Q_{AD}^{air})}(Q_{AD})} \times Q_{AD} \qquad (8)$$

The final equality in Equations (6)-(8) defines the porosity uncertainty. The pertinent data may be framed in terms of vertical resolution. The total porosity uncertainty may be less than 1 pu per 2 ft interval logged at a rate of penetration ("ROP") of 100 ft/hr in fresh conditions. Assuming a scan rate of about 30 seconds, this translates into a maximum porosity uncertainty of approximately 1.5 p.u. per scan, or a fractional porosity uncertainty of 1.5/20=7.5% in a 20 p.u. formation. A substantial fraction of this uncertainty budget may be assigned to the NMR measurement uncertainty defined by the intrinsic NSR per echo. With this in mind, a target for the uncertainty budget ($\Delta\Phi/\Phi$) assigned to the $Q_{AD}$ measurement may be ~2.5%. Assuming uncorrelated noise in the NMR and Q measurements, this leaves about 7% uncertainty allowance for the NMR measurement, or 1.4 p.u. uncertainty in a 20 p.u. formation, which may be calculated using Equation (9):

$$\frac{Q_{AD}}{Q_{AD}} = \frac{2.5}{100} \times \left[\frac{A}{B} + \log(Q_{AD})\right] \qquad (9)$$

Figure 19:
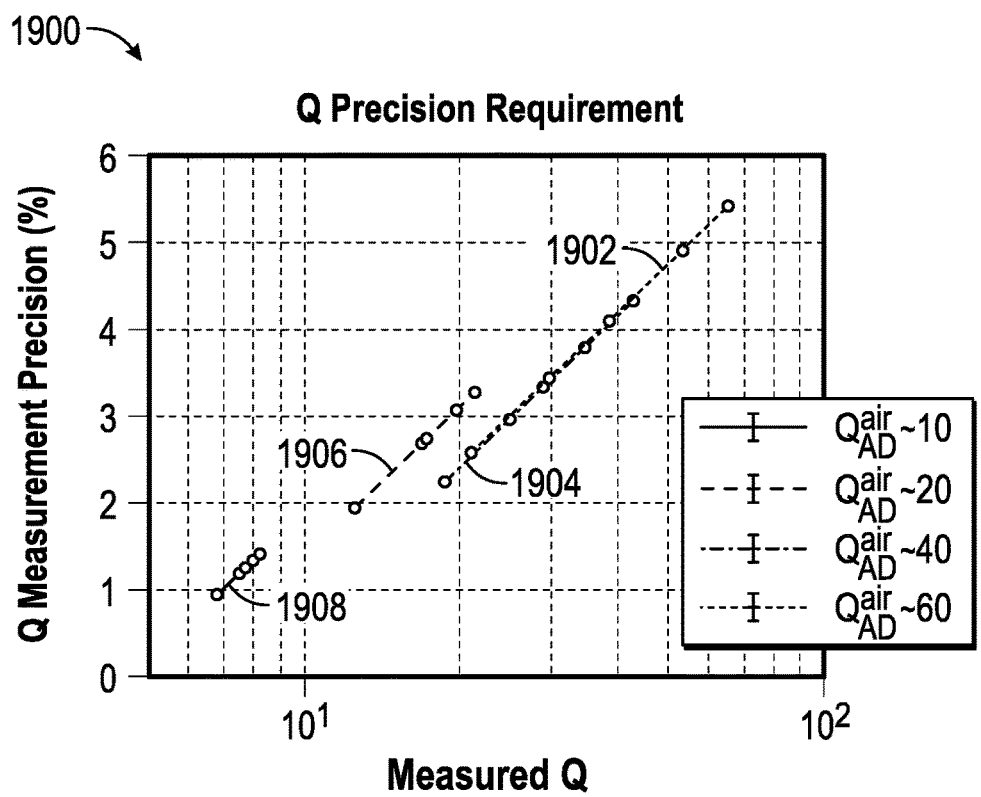
FIG. 19 depicts a graph showing measurements of maximum error as a function of measured $Q_{AD}$ for active damping receivers with $Q_{AD}^{air}$~10, $Q_{AD}^{air}$~20, $Q_{AD}^{air}$~40, and $Q_{AD}^{air}$~60, according to an embodiment.

The resulting $Q_{AD}$ measurement % error is plotted in FIG. 19 and summarized in Table 3. FIG. 19 depicts a graph 1900 showing measurements of maximum error as a function of measured $Q_{AD}$ for active damping receivers with $Q_{AD}^{air}$~10, $Q_{AD}^{air}$~20, $Q_{AD}^{air}$~40, and $Q_{AD}^{air}$~60, according to an embodiment. Reference number 1902 refers to the line representing $Q_{AD}^{air}$~60, reference number 1904 refers to the line representing $Q_{AD}^{air}$~40, reference number 1906 refers to the line representing $Q_{AD}^{air}$~20, and reference number 1908 refers to the line representing $Q_{AD}^{air}$~10.

TABLE 3

|  | $Q_{AD}^{air}$~10 | $Q_{AD}^{air}$~20 | $Q_{AD}^{air}$~40 | $Q_{AD}^{air}$~60 |
| --- | --- | --- | --- | --- |
| Maximum $Q_{AD}$ Measurement Fractional Error (%) | 0.9-1.5 | 1.9-3.2 | 2.2-4.3 | 2.5-5.4 |
| Maximum $Q_{AD}$ Measurement Standard Deviation | 0.03-0.06 | 0.12-0.35 | 0.20-0.90 | 0.25-1.75 |

As shown in FIG. 19 and described in Table 3, the maximum standard deviation is defined as half the maximum absolute error. The ranges in Table 3 reflect the variation in measured $Q_{AD}$ due to environment conductivity. The $Q_{AD}$ measurement precision may be enhanced for low active damping $Q_{AD}^{air}$. A 2%-3% $Q_{AD}$ measurement precision may be obtained for $Q_{AD}^{air}$~20. This measurement precision may become more stringent with increasing salinity.

Figure 20:
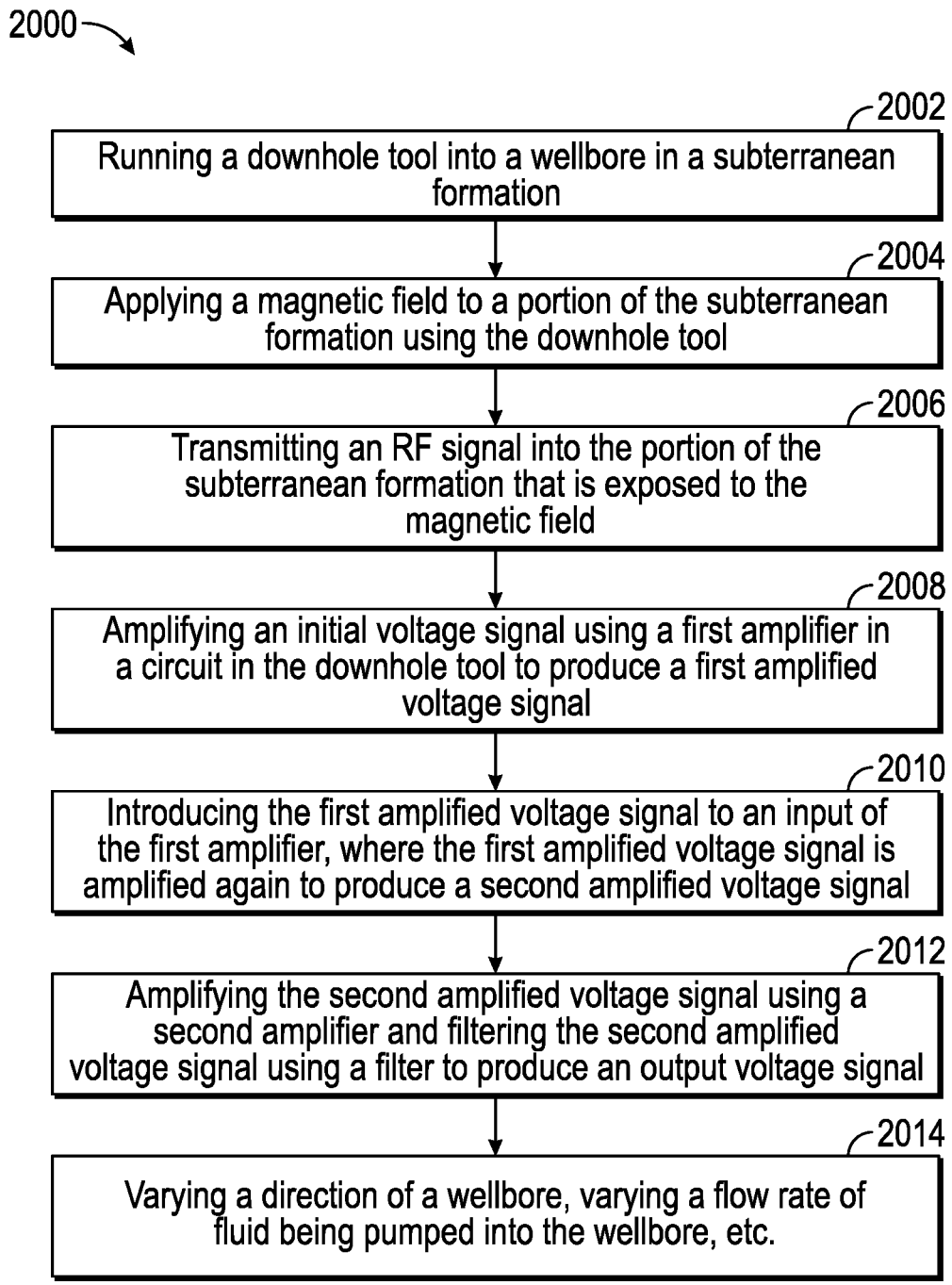
FIG. 20 depicts a flow chart of a method for measuring one or more properties of a subterranean formation, according to an embodiment.

FIG. 20 depicts a flow chart of a method 2000 for measuring one or more properties of a subterranean formation, according to an embodiment. The method 2000 may include running a downhole tool 112 into a wellbore in a subterranean formation, as at 2002. The downhole tool 112 may include one or more LWD tools 138, 140 and/or a NMR logging tool 150, as described above. The method 2000 may then include applying a magnetic field to a portion of the subterranean formation using the downhole tool 112 (e.g., using the NMR logging tool 150), as at 2004.

The method 2000 may also include transmitting one or more radiofrequency ("RF") signals (e.g., pulses) into the portion of the subterranean formation that is exposed to the magnetic field, as at 2006. The RF signals may induce transverse magnetization in the subterranean formation that encodes different properties of the subterranean formation. For example, the initial amplitude of the magnetization may be directly proportional to the porosity of the subterranean formation. The transverse magnetization may induce an initial voltage signal 202 (see FIG. 2) in the antenna 152 of the resonant circuit 200 in the NMR logging tool 150.

The method 2000 may also include amplifying the initial voltage signal 202 using a first amplifier (e.g., a preamplifier 212) in a circuit 200 in the downhole tool 112 (e.g., in the NMR logging tool 150) to produce a first amplified voltage signal 213, as at 2008. In some embodiments, the porosity of the subterranean formation may be inferred directly from the amplitude of the first amplified voltage signal 213. However, in other embodiments, the amplitude of the first amplified voltage signal 213 may depend on the amplitude of the transverse magnetization as well as on the bandwidth of the tuned circuit 200. In conventional NMR logging tools, the bandwidth of the tuned circuit may be strongly affected by the electrical properties of the subterranean formation and the fluid in the wellbore. These electrical properties may change, even during the measurements, thus making it challenging to directly relate the amplitude of the first amplified voltage signal 213 to the porosity of the subterranean formation.

The method 2000 may also include introducing the first amplified voltage signal 213 (from an output of the first amplifier (e.g., preamplifier 212)) to an input of the first amplifier (e.g., preamplifier 212), where the first amplified voltage signal 213 is amplified again to produce a second amplified voltage signal 218, as at 2010. In one embodiment, the first amplified voltage signal 213 from the output of the first amplifier (e.g., preamplifier 212) may pass through an integrator 214 and/or a capacitor 216 prior to being introduced into the input of the first amplifier (e.g., preamplifier 212). Introducing this first amplified voltage signal 213 into the input of the first amplifier (e.g., preamplifier 212) may cause the bandwidth of the circuit 200 to be maintained or increase and remain substantially stable and essentially unaffected by the electrical properties of the subterranean formation. The bandwidth may be $\omega_0/Q_{AD}$. In addition, introducing the first amplified voltage signal 213 into the input of the first amplifier (e.g., preamplifier 212) may not add much noise to the second amplified voltage signal 218. The added noise may be lower than the intrinsic noise generated from the conductive fluids around the detection coil and the ohmic losses in the coil. Furthermore, the wide detection bandwidth resulting from this feedback loop may reduce the amount of ringing that may occur in the antenna 152, which may interfere with the second amplified voltage signal 218. FIGS. 15-17 show quantitative results of this reduction. In FIG. 15, the reduction in ringing about 400 μs after the pulse is about 100-fold.

The method 2000 may also include amplifying the second amplified voltage signal 218 using a second amplifier 220 and filtering the second amplified voltage signal 218 using a filter 222 to produce an output voltage signal 224, as at 2012. The output voltage signal 224 may be used to quantitatively infer intrinsic properties of the subterranean formation (e.g., porosity, relaxation properties, diffusion properties, etc.) unaffected by the electrical properties of the subterranean formation or the fluid in the wellbore. The method 2000 may also include varying the direction that the wellbore 102 is drilled, or varying the flow rate of the fluid being pumped into the wellbore 102, in response to the output voltage signal 224, as at 2014.

Figure 21:
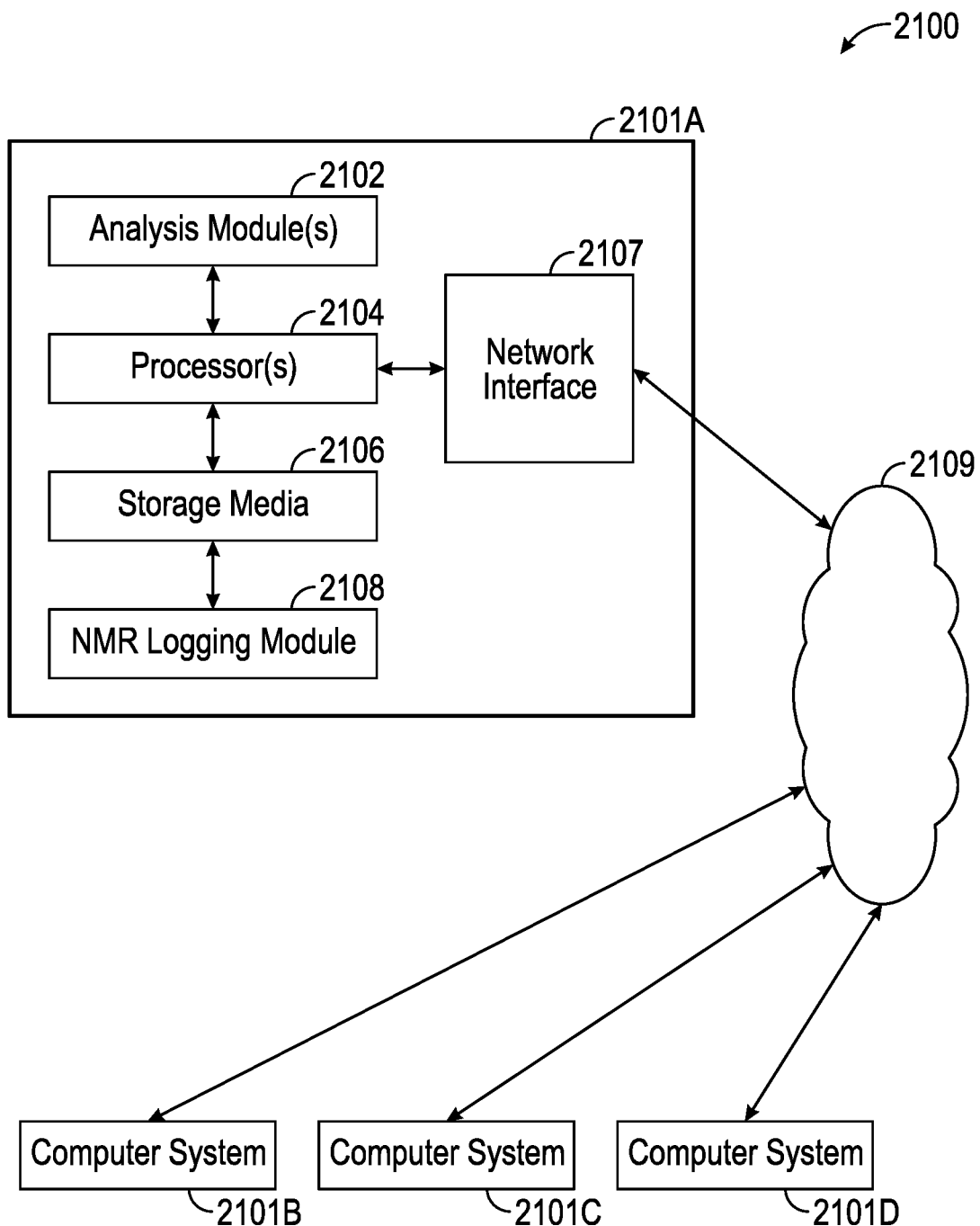
FIG. 21 depicts a schematic view of a computing system for performing the method, according to an embodiment.

FIG. 21 depicts a schematic view of a computing system 2100 for performing the method, according to an embodiment. The computing system 2100 may include a computer or computer system 2101A, which may be an individual computer system 2101A or an arrangement of distributed computer systems. The computer system 2101A includes one or more license modules 2102 that are configured to perform various tasks according to some embodiments, such as one or more methods disclosed herein. To perform these various tasks, the license module 2102 executes independently, or in coordination with, one or more processors 2104, which is (or are) connected to one or more storage media 2106. The processor(s) 2104 is (or are) also connected to a network interface 2107 to allow the computer system 2101A to communicate over a data network 2109 with one or more additional computer systems and/or computing systems, such as 2101B, 2101C, and/or 2101D (note that computer systems 2101B, 2101C and/or 2101D may or may not share the same architecture as computer system 2101A, and may be located in different physical locations, e.g., computer systems 2101A and 2101B may be located in a processing facility, while in communication with one or more computer systems such as 2101C and/or 2101D that are located in one or more data centers, and/or located in varying countries on different continents).

A processor may include a microprocessor, microcontroller, processor module or subsystem, programmable integrated circuit, programmable gate array, or another control or computing device.

The storage media 2106 may be implemented as one or more computer-readable or machine-readable storage media. Note that while in the example embodiment of FIG. 21 storage media 2106 is depicted as within computer system 2101A, in some embodiments, storage media 2106 may be distributed within and/or across multiple internal and/or external enclosures of computing system 2101A and/or additional computing systems. Storage media 2106 may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLURAY® disks, or other types of optical storage, or other types of storage devices. Note that the instructions discussed above may be provided on one computer-readable or machine-readable storage medium, or alternatively, may be provided on multiple computer-readable or machine-readable storage media distributed in a large system having possibly plural nodes. Such computer-readable or machine-readable storage medium or media is (are) considered to be part of an article (or article of manufacture). An article or article of manufacture may refer to any manufactured single component or multiple components. The storage medium or media may be located either in the machine running the machine-readable instructions, or located at a remote site from which machine-readable instructions may be downloaded over a network for execution.

In some embodiments, computing system 2100 contains a NMR logging module 2108. In the example of computing system 2100, computer system 2101A includes the NMR logging module 2108. The NMR logging module 2108 may be used to perform one or more aspects of the method 2000.

It should be appreciated that computing system 2100 is merely one example of a computing system, and that computing system 2100 may have more or fewer components than shown, may combine additional components not depicted in the example embodiment of FIG. 21, and/or computing system 2100 may have a different configuration or arrangement of the components depicted in FIG. 21. The various components shown in FIG. 21 may be implemented in hardware, software, or a combination of both hardware and software, including one or more signal processing and/or application specific integrated circuits.

Further, the steps in the processing methods described herein may be implemented by running one or more functional modules in information processing apparatus such as general purpose processors or application specific chips, such as ASICs, FPGAs, PLDs, or other appropriate devices. These modules, combinations of these modules, and/or their combination with general hardware are included within the scope of the present disclosure.

As used herein, the terms "inner" and "outer"; "up" and "down"; "upper" and "lower"; "upward" and "downward"; "above" and "below"; "inward" and "outward"; and other like terms as used herein refer to relative positions to one another and are not intended to denote a particular direction or spatial orientation. The terms "couple," "coupled," "connect," "connection," "connected," "in connection with," and "connecting" refer to "in direct connection with" or "in connection with via one or more intermediate elements or members."

Although the preceding description has been described herein with reference to particular means, materials, and embodiments, it is not intended to be limited to the particulars disclosed herein; rather, it extends to all functionally equivalent structures, methods, and uses, such as are contemplated within the scope of the appended claims. While the foregoing is directed to embodiments of the present invention, other and further embodiments of the invention may be devised without departing from the basic scope thereof.

What is claimed is:

1. A method for measuring one or more properties of a formation, comprising:
    applying a magnetic field to a subterranean formation using a downhole tool in a wellbore;
    transmitting a radiofrequency signal into the subterranean formation that is exposed to the magnetic field, wherein the radiofrequency signal induces a transverse magnetization in the subterranean formation, and wherein the transverse magnetization induces an initial voltage signal in the downhole tool;
    amplifying the initial voltage signal using a first amplifier in the downhole tool such that the first amplifier outputs a first amplified voltage signal; and
    introducing the first amplified voltage signal to an input of the first amplifier, such that the first amplifier amplifies the first amplified voltage signal and outputs a second amplified voltage signal, wherein the first amplified voltage signal is introduced to a capacitor prior to introducing the first amplified voltage signal to the input of the first amplifier,
    wherein a selected value of the capacitor provides active damping to the downhole tool that reduces a variation of a receiver in the downhole tool with respect to variations in salinity of fluid in the wellbore.

2. The method of claim 1, further comprising integrating the first amplified voltage signal prior to introducing the first amplified voltage signal to the input of the first amplifier.

3. The method of claim 1, further comprising: introducing the first amplified voltage signal to an integrator; and introducing the first amplified voltage signal to the capacitor after the first amplified voltage signal is introduced. to the integrator and before the first amplified voltage signal is introduced to the input of the first amplifier.

4. The method of claim 1, further comprising amplifying the second amplified voltage signal using a second amplifier in the downhole tool such that the second amplifier outputs an output voltage.

5. The method of claim 4, further comprising filtering the output voltage using a filter to produce a filtered output voltage.

6. The method of claim 5, further comprising determining one or more properties of the subterranean formation using the filtered output voltage.

7. The method of claim 6, wherein the one or more properties are selected from the group consisting of porosity, a relaxation property, and a diffusion property.

8. The method of claim 1, further comprising varying a direction that a wellbore is drilled in the subterranean formation at least partially in response to the second amplified voltage signal.

9. The method of claim 1 wherein the capacitor value is selected to provide active damping characterized by a Q value.

10. The method of claim 9 wherein the Q value is less than 40 and greater than 10.

11. The method of claim 10 wherein the Q value is approximately 20.

12. The method of claim 1 wherein the selected capacitor value reduces the variation of the receiver in the downhole tool with respect to variations in salinity of fluid in the wellbore for a range of salinities that correspond to water resistivities less than approximately 1.28 Ohm-m.

13. A method for measuring one or more properties of a formation, comprising:
running a downhole tool into a wellbore in a subterranean formation;
applying a magnetic field to the subterranean formation using the downhole tool transmitting a radiofrequency signal into the subterranean formation that is exposed to the magnetic field, wherein the radiofrequency signal induces a transverse magnetization in the subterranean formation, and wherein the transverse magnetization induces an initial voltage signal in the downhole tool;
amplifying the initial voltage signal using a first amplifier in the downhole tool such that the first amplifier outputs a first amplified voltage signal;
introducing the first amplified voltage signal to an integrator;
introducing the first amplified voltage signal to a capacitor;
introducing the first amplified voltage signal to an input of the first amplifier after the first amplified voltage signal is introduced to the integrator and the capacitor, such that the first amplifier amplifies the first amplified voltage signal and outputs a second amplified voltage signal, wherein a selected value of the capacitor provides active damping to the downhole tool that reduces a variation of a receiver in the downhole tool with respect to variations in salinity of fluid in the wellbore;
amplifying the second amplified voltage signal using a second amplifier in the downhole tool such that the second amplifier outputs an output voltage; and
determining one or more properties of the subterranean formation using the output voltage.

14. The method of claim 13, further comprising filtering the output voltage using a filter.

15. The method of claim 14, further comprising varying a flow rate of a fluid being pumped into the wellbore at least partially in response to the second amplified voltage signal.

16. An apparatus for measuring one or more properties of a formation, comprising:
an antenna configured to receive an initial voltage signal;
a first amplifier electrically-connected to the antenna and configured to receive the initial voltage signal from the antenna and to produce a first amplified voltage signal;
an integrator electrically-coupled to an output of the first amplifier and configured to receive the first amplified voltage signal from the first amplifier; and
a first capacitor electrically-coupled to the integrator and configured to receive the first amplified voltage signal from the integrator, wherein an output of the first capacitor is electrically-connected to an input of the first amplifier, and wherein the first amplified voltage signal is introduced to the input of the first amplifier after the first amplified voltage signal is introduced to the integrator and the first capacitor, such that the first amplifier amplifies the first amplified voltage signal and outputs a second amplified voltage signal, wherein a selected value of the first capacitor provides active damping to the apparatus that reduces a variation of the apparatus with respect to variations in salinity of fluid in a wellbore in the formation.

17. The apparatus of claim 16, wherein the initial voltage signal is induced in response to transverse magnetization in a subterranean formation, and wherein the transverse magnetization in the subterranean formation is in response to a radiofrequency signal being transmitted into a portion of the subterranean formation exposed to a magnetic field.

18. The apparatus of claim 16, wherein the antenna comprises an inductor, a resistor that is electrically-connected in series to the inductor, and a second capacitor that is electrically-connected to and in parallel with the inductor and the resistor.

19. The apparatus of claim 18, further comprising a duplexer electrically-connected to and positioned between the antenna and the first amplifier.

20. The apparatus of claim 19, further comprising a second amplifier electrically-connected to the output of the first amplifier, wherein the second amplifier is configured to receive the second amplified voltage signal and to produce an output voltage.

* * * * *